US009243791B2

(12) United States Patent
Agatani et al.

(10) Patent No.: US 9,243,791 B2
(45) Date of Patent: Jan. 26, 2016

(54) LIGHT-EMITTING DEVICE AND LIGHTING DEVICE PROVIDED WITH THE SAME

(71) Applicant: Sharp Kabushiki Kaisha, Osaka-shi, Osaka (JP)

(72) Inventors: Makoto Agatani, Osaka (JP); Toshio Hata, Osaka (JP); Tomokazu Nada, Osaka (JP); Shinya Ishizaki, Osaka (JP)

(73) Assignee: SHARP KABUSHIKI KAISHA, Osaka-Shi, Osaka (JP)

( * ) Notice: Subject to any disclaimer, the term of this patent is extended or adjusted under 35 U.S.C. 154(b) by 87 days.

(21) Appl. No.: 14/243,521

(22) Filed: Apr. 2, 2014

(65) Prior Publication Data

US 2014/0268783 A1 Sep. 18, 2014

Related U.S. Application Data

(63) Continuation of application No. 13/242,329, filed on Sep. 23, 2011, now Pat. No. 9,018,832.

(30) Foreign Application Priority Data

Sep. 30, 2010 (JP) ................................. 2010-222440

(51) Int. Cl.
*H01L 25/13* (2006.01)
*H01L 33/62* (2010.01)
(Continued)

(52) U.S. Cl.
CPC . *F21V 23/06* (2013.01); *F21K 9/00* (2013.01); *H01L 25/0753* (2013.01); *H01L 33/54* (2013.01); *H01L 33/62* (2013.01); *H05K 1/11* (2013.01); *H01L 33/52* (2013.01);
(Continued)

(58) Field of Classification Search
CPC ...................................... H01L 25/075–25/0756
See application file for complete search history.

(56) References Cited

U.S. PATENT DOCUMENTS 6,489,637 B1 12/2002 Sakamoto et al.
6,515,372 B1 2/2003 Narizuka et al.
(Continued)

FOREIGN PATENT DOCUMENTS

CN 1783471 A 6/2006
JP 55-16415 A 2/1980
(Continued)

OTHER PUBLICATIONS

English translation of the Japanese Office Action mailed Nov. 19, 2013 in Japanese Patent Application 2010-222440.
(Continued)

*Primary Examiner* — Mariceli Santiago
(74) *Attorney, Agent, or Firm* — Nixon & Vanderhye, P.C.

(57) ABSTRACT

A light-emitting device capable of ensuring an electric connection between a light-emitting element and an electrode without generating any problem in practical use, by both connecting methods with a solder and a connector, and a lighting device provided with the light-emitting device are provided. The light-emitting device according to the present invention has a plurality of LED chips, and a soldering electrode land and a connector connecting electrode land electrically connected to the chips, on a ceramic substrate. The soldering electrode land is formed of a first conductive material having a function to prevent diffusion to a solder, and the connector connecting electrode land is formed of a second conductive material having a function to prevent oxidation.

12 Claims, 12 Drawing Sheets

(51) Int. Cl.
  *F21V 23/06* (2006.01)
  *H01L 25/075* (2006.01)
  *F21K 99/00* (2010.01)
  *H05K 1/11* (2006.01)
  *H01L 33/54* (2010.01)
  *H01L 33/52* (2010.01)

(52) U.S. Cl.
  CPC ............ *H01L2224/48091* (2013.01); *H01L 2224/48137* (2013.01); *H01L 2924/01327* (2013.01); *H01L 2933/0066* (2013.01); *H05K 2201/0391* (2013.01); *H05K 2201/094* (2013.01); *H05K 2201/0979* (2013.01); *H05K 2201/10106* (2013.01)

(56) References Cited

U.S. PATENT DOCUMENTS

| | | | |
|---|---|---|---|
| 7,690,817 B2 | 4/2010 | Sanpei et al. | |
| 8,217,412 B2 | 7/2012 | Yuan et al. | |
| 8,427,048 B2 | 4/2013 | Konishi et al. | |
| 8,564,000 B2 * | 10/2013 | Hussell | H01L 25/0753 257/100 |
| 8,632,226 B2 | 1/2014 | Hata et al. | |
| 2002/0113246 A1 | 8/2002 | Nagai et al. | |
| 2006/0164813 A1 | 7/2006 | Yoshioka et al. | |
| 2008/0224608 A1 | 9/2008 | Konishi et al. | |
| 2010/0123163 A1 | 5/2010 | Ohtorii et al. | |
| 2010/0220479 A1 | 9/2010 | Yamashita et al. | |
| 2010/0244662 A1 * | 9/2010 | Uemoto | H01L 33/508 313/501 |
| 2011/0044029 A1 | 2/2011 | Konishi et al. | |
| 2011/0180817 A1 * | 7/2011 | Ishizaki | H01L 25/0753 257/88 |
| 2011/0272713 A1 | 11/2011 | Wirth | |
| 2011/0316011 A1 | 12/2011 | Ito et al. | |
| 2013/0181250 A1 | 7/2013 | Konishi et al. | |

FOREIGN PATENT DOCUMENTS

| | | |
|---|---|---|
| JP | 58-78678 U | 5/1983 |
| JP | 2000-101147 A | 4/2000 |
| JP | 2002-336275 A | 11/2002 |
| JP | 2007-12978 A | 1/2007 |
| JP | 2007-116095 | 5/2007 |
| JP | 2007-116122 A | 5/2007 |
| JP | 2008-21867 A | 1/2008 |
| JP | 2008-227412 A | 9/2008 |
| JP | 2008-251663 A | 10/2008 |
| JP | 2009-055006 A | 3/2009 |
| JP | 2009-76576 A | 4/2009 |
| JP | 2009-222793 A | 10/2009 |
| JP | 2009-231027 A | 10/2009 |
| JP | 2010-123780 A | 6/2010 |
| JP | 2010-199248 A | 9/2010 |
| JP | 2010-205776 A | 9/2010 |
| JP | 2010-205920 A | 9/2010 |
| WO | 2006/129690 A1 | 12/2006 |
| WO | 2010-022348 A1 | 2/2010 |
| WO | 2010/054622 A2 | 5/2010 |

OTHER PUBLICATIONS

English translation of Chinese Office Action mailed Jan. 15, 2014 in Chinese patent application 2011103019650.

Notice of Allowance mailed Jan. 30, 2015 in U.S. Appl. No. 13/242,329.

* cited by examiner

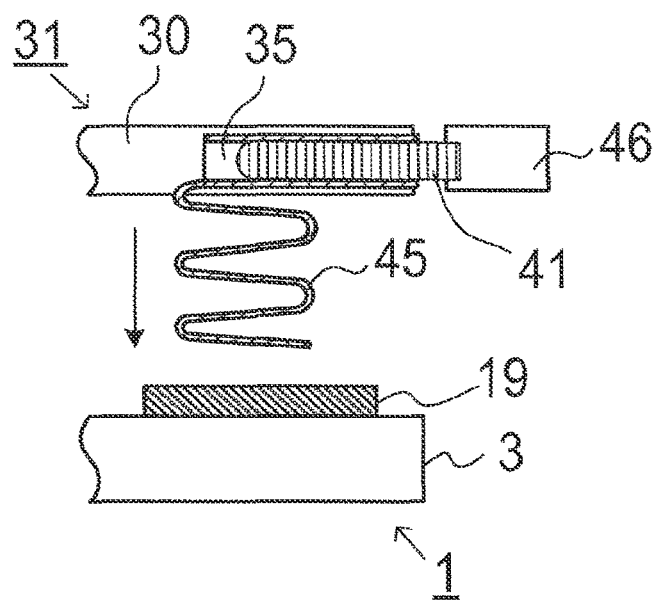
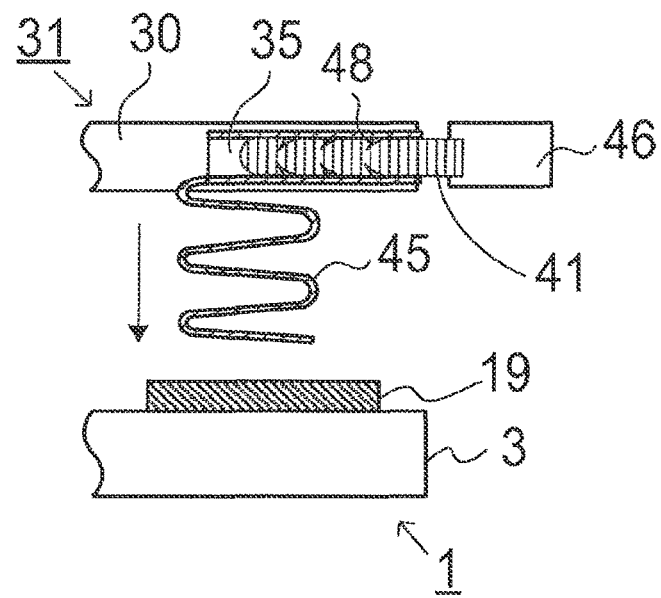

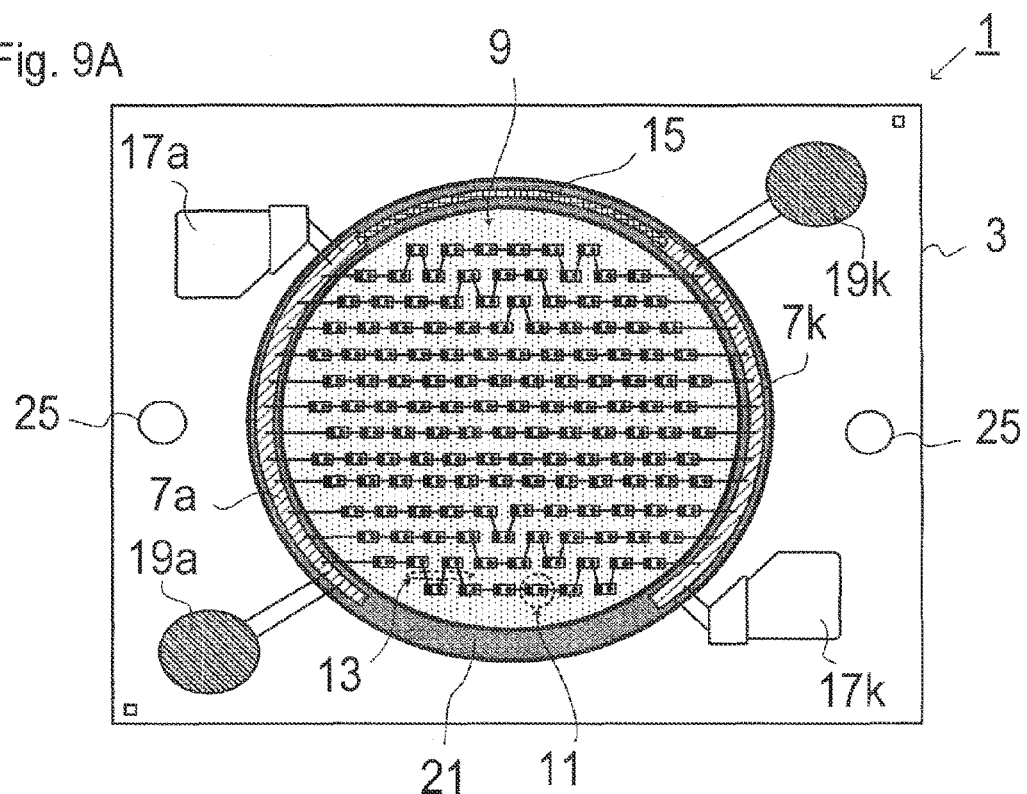
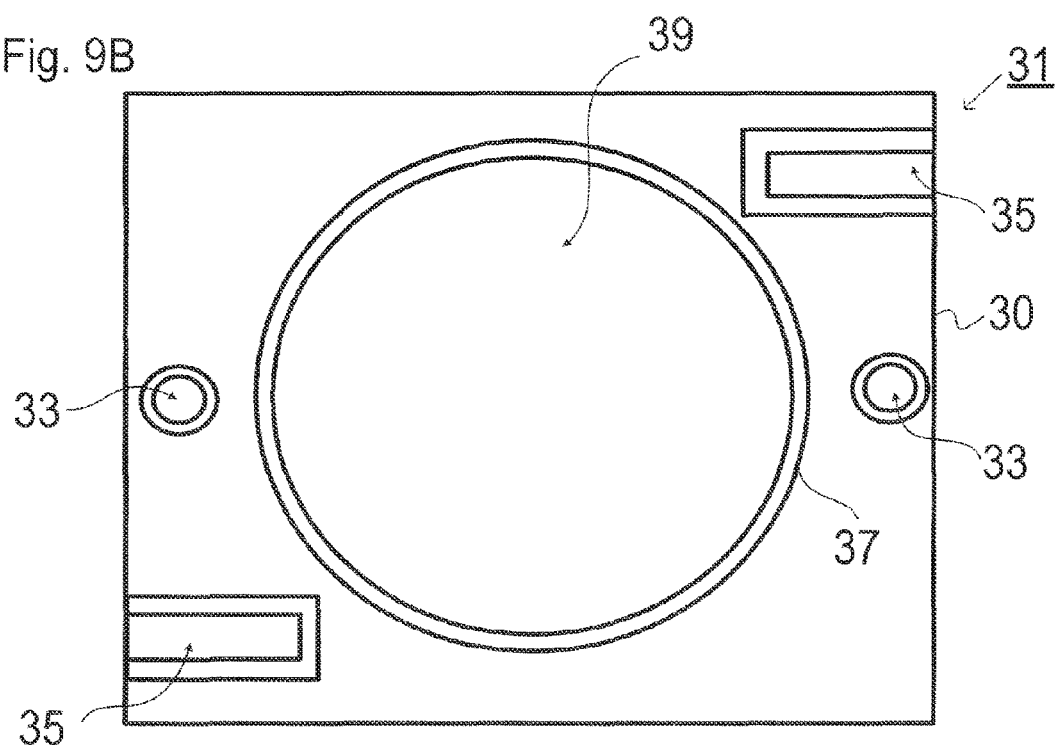

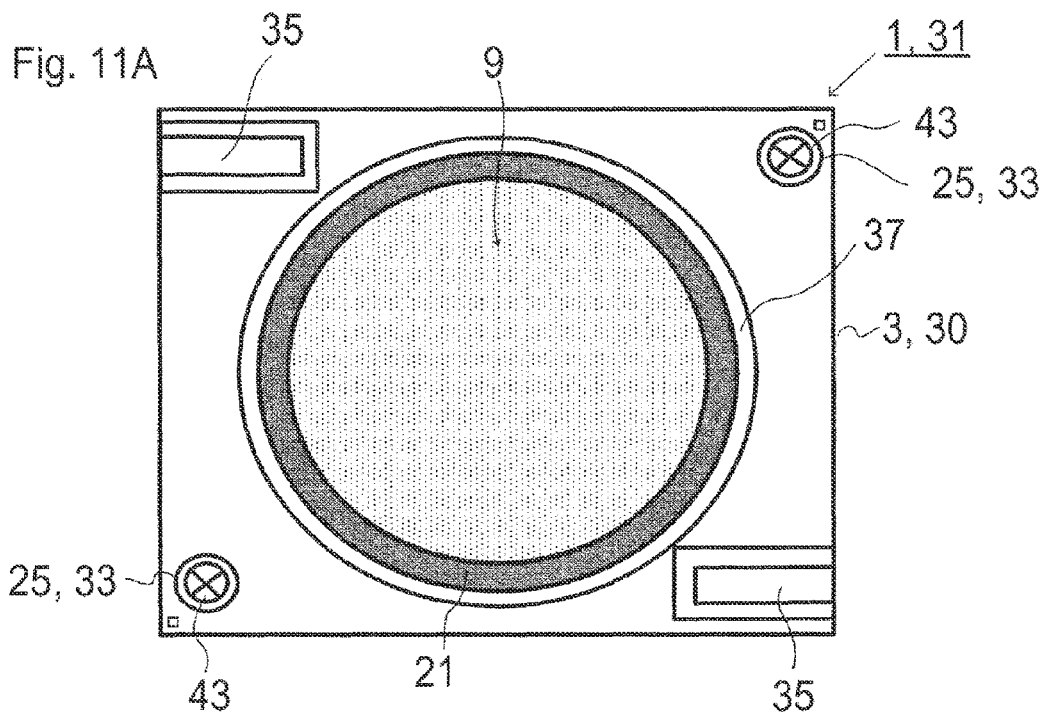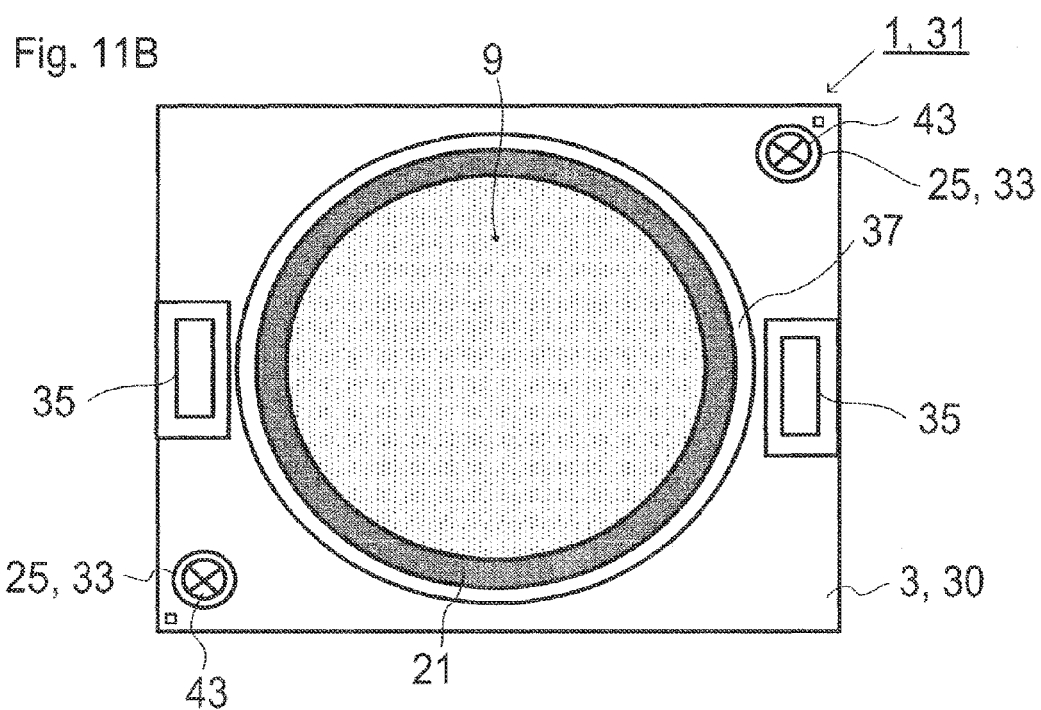

LIGHT-EMITTING DEVICE AND LIGHTING DEVICE PROVIDED WITH THE SAME

CROSS REFERENCE TO RELATED APPLICATION

This application is a continuation of U.S. patent application Ser. No. 13/242,329 filed Sep. 23, 2011, pending, which is a non-provisional application which claims priority under 35 U.S.C. §119(a) on Patent Application No. 2010-222440 filed in Japan on Sep. 30, 2010, the entire contents of each of which are hereby incorporated by reference.

BACKGROUND OF THE INVENTION

1. Field of the Invention

The present invention relates to a light-emitting device and a lighting device provided with the same.

2. Description of the Related Art

Conventionally, a light-emitting device is provided with a light-emitting element (refer to Japanese Patent Laying-Open No. 2007-116095 (hereinafter, referred to as the patent document 1)).

FIG. 12 is a schematic structure diagram of a light-emitting device disclosed in the patent document 1. A light-emitting device 100 includes a LED chip 101, and the LED chip 101 is mounted on a wiring substrate 103. The wiring substrate 103 serves as a base member of the LED chip 101.

An electrode provided on one surface side of the LED chip 101 is connected to a bonding wire 105, and the bonding wire 105 extends in a direction along one diagonal line of the LED chip 101.

References 107 and 109 each represent a conductor pattern, and each of them is composed of a laminated film having a Cu film, a Ni film, and an Au film. In a planar view, a part on the inner side of a frame (reflector (not shown)) serves as the inner lead 107, and a part on the outer side of the frame serves as the outer lead 109.

As disclosed in the patent document 1, in a case where the conductor pattern to be externally connected is formed of gold (Au film) on the substrate 103, and a solder is used to externally connect the conductor pattern, the gold contained in the conductor pattern is diffused in the solder and an intermetallic compound is formed in some cases. Thus, when this phenomenon is repeatedly generated, the Au film, the Cu film, and the Ni film disappear, and an electrode land and the solder are not connected, which is inconvenient in practical use.

In addition, a user who wants to make an external connection with a connector other than the solder cannot use the light-emitting device disclosed in the patent document 1. Meanwhile, a user who wants to make the external connection with the solder suffers from the above problem.

SUMMARY OF THE INVENTION

The present invention was made in view of the above problem, and it is an object of the present invention to provide a light-emitting device capable of ensuring an electric connection between a light-emitting element and an electrode by both connecting methods with a solder and a connector without generating any problem in practical use, and a lighting device provided with the light-emitting device.

In addition, it is an object of the present invention to provide a light-emitting device capable of densely and compactly mounting LED chips.

In order to attain the above object, a light-emitting device according to the present invention is characterized by including a light-emitting part, and a soldering electrode land and a connector connecting electrode land each electrically connected to the light-emitting part, on a substrate, in which the soldering electrode land is formed of a first conductive material having a function to prevent diffusion to a solder, and the connector connecting electrode land is formed of a second conductive material having a function to prevent oxidation.

At this time, it is preferable that the soldering electrode land has an uppermost surface made of the first conductive material, and the connector connecting electrode land has an uppermost surface made of the second conductive material.

The first conductive material includes any one of Ag, Ag—Pt and Ag—Pd.

In addition, the second conductive material includes Au.

Furthermore, the light-emitting device is further characterized in that the soldering electrode land includes a pair of a first soldering electrode land connected to an anode, and a second soldering electrode land connected to a cathode, and the connector connecting electrode land includes a pair of a first connector connecting electrode land connected to the anode and a second connector connecting electrode land connected to the cathode.

At this time, it is preferably that the substrate has a rectangular shape, and either or both of the pair of the first soldering electrode land and the second soldering electrode land, and the pair of the first connector connecting electrode land and the second connector connecting electrode land are arranged at corners of the substrate.

In addition, the light-emitting device is characterized in that a first wiring pattern connected to the anode, and a second wiring pattern connected to the cathode are arranged so as to be opposed to each other on the substrate, and the light-emitting part is electrically connected to the first soldering electrode land and the first connector connecting electrode land through the first wiring pattern, and electrically connected to the second soldering electrode land and the second connector connecting electrode land through the second wiring pattern.

At this time, the first wiring pattern and the second wiring pattern have respective arc shapes each constituting a part of the same circular ring, and the light-emitting part is covered with a sealing body filled in the circular ring.

In addition to the above characteristics, the light-emitting device is characterized by including a printing resistive element having one end connected to one end of the first wiring pattern, and having the other end connected to one end of the second wiring pattern, in which the printing resistive element has an arc shape constituting a part of the circular ring.

According to the shape of the above light-emitting device, the light-emitting device can show rotation symmetry with the LED chips arranged in the inner side of the circular ring. At this time, the series circuits each composed of the LED chips connected in series are arranged as parallel lines, so that the light-emitting device can implement high luminance of 25 W or more.

According to the shape of the above light-emitting device, the light-emitting device can show rotation symmetry with the LED chips arranged in the inner side of the circular ring. At this time, the series circuits each composed of the LED chips connected in series are arranged as parallel lines, so that the light-emitting device can implement high luminance of 25 W or more.

In addition, a lighting device is characterized by including the light-emitting device having the above characteristics, and a connector jig, in which the connector jig includes a resin plate having a light-emitting surface opening, and a connector terminal opening to be penetrated by a connector terminal, and the light-emitting device and the connector jig are overlapped in such a manner that the light-emitting part is exposed in the light-emitting surface opening, and the connector connecting electrode land and the connector terminal opening are opposed to each other.

In addition to the above characteristics, the lighting device is further characterized in that an outer periphery of the connector jig does not protrude from an outer periphery of the light-emitting device when viewed from a direction perpendicular to an overlapped surface of the light-emitting device and the connector jig.

According to the light-emitting device of the present invention, since the soldering electrode land and the connector connecting electrode land are both previously provided on the substrate, either one of the connection with the solder and the connector can be employed according to a usage way of the user when the user tries to ensure the external electric connection. Thus, a versatile light-emitting device can be provided.

In addition, in the case of the external connection with the solder, the present invention solves the problem that Au is diffused in the solder and the intermetallic compound is formed, so that electric connection cannot be ensured like the conventional case because the soldering electrode land is formed of the first conductive material having the function to prevent diffusion to the solder.

BRIEF DESCRIPTION OF THE DRAWINGS

FIGS. 6A and 6B are views to explain a method for ensuring electric connection between a connector connecting electrode land and the connector jig;

FIGS. 9A and 9B are schematic structure diagrams showing another example of the light-emitting device according to the present invention;

FIGS. 11A and 11B are schematic structure diagrams showing another state in which the connector jig and the light-emitting device are overlapped.

DESCRIPTION OF THE PREFERRED EMBODIMENTS

Figure 1A:
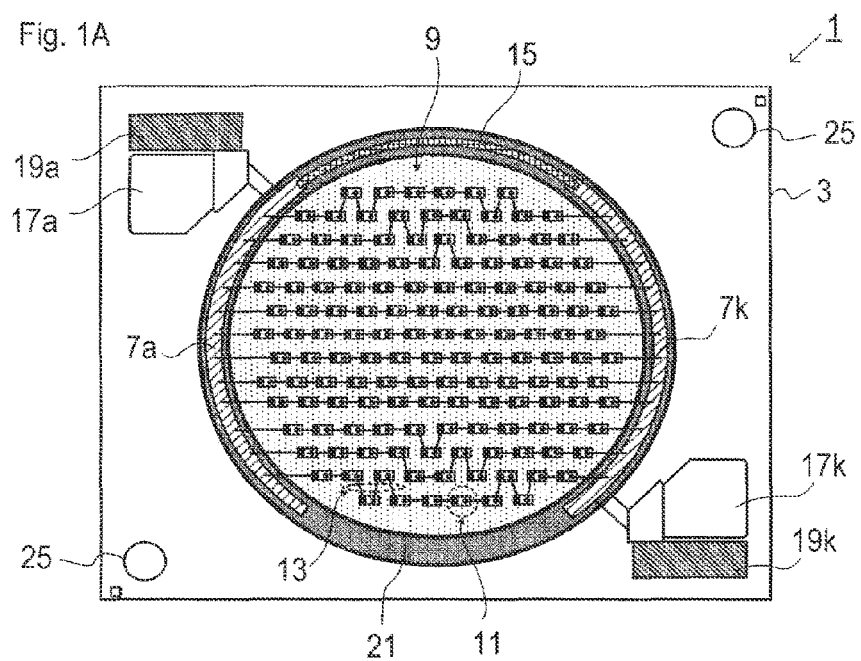
FIGS. 1A and 1B are schematic structure diagrams showing one example of a light-emitting device according to the present invention.
Figure 1B:
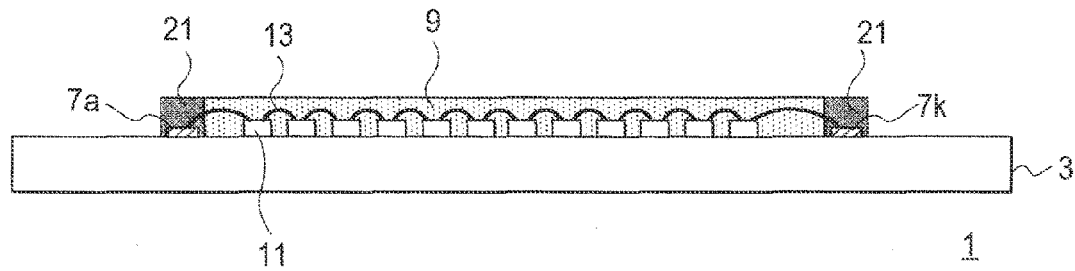

FIGS. 1A and 1B are schematic structure diagrams showing one example of a light-emitting device of this embodiment. As shown in FIGS. 1A and 1B, a light-emitting device 1 according to this embodiment includes a ceramic substrate 3, wiring patterns 7 (7a and 7k), a phosphor containing resin layer 9, LED chips 11, a wire 13, a printing resistive element 15, soldering electrode lands 17 (17a and 17k), connector connecting electrode lands 19 (19a and 19k), a resin dam 21, and positioning openings 25. In addition, FIG. 1A is a top view and FIG. 1B is a cross-sectional view. In FIG. 1A, an inner side is transparently shown in order to make a connection relationship clear.

Figure 2A:
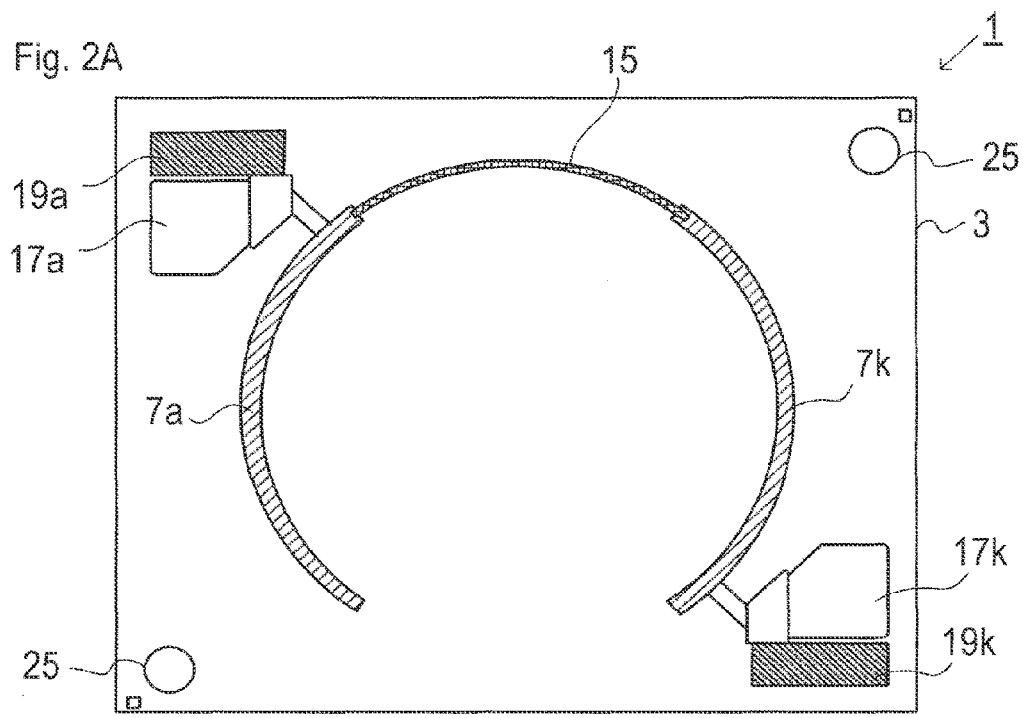
FIGS. 2A and 2B are schematic structure diagrams showing a stage before the light-emitting device according to the present invention is completed.
Figure 2B:
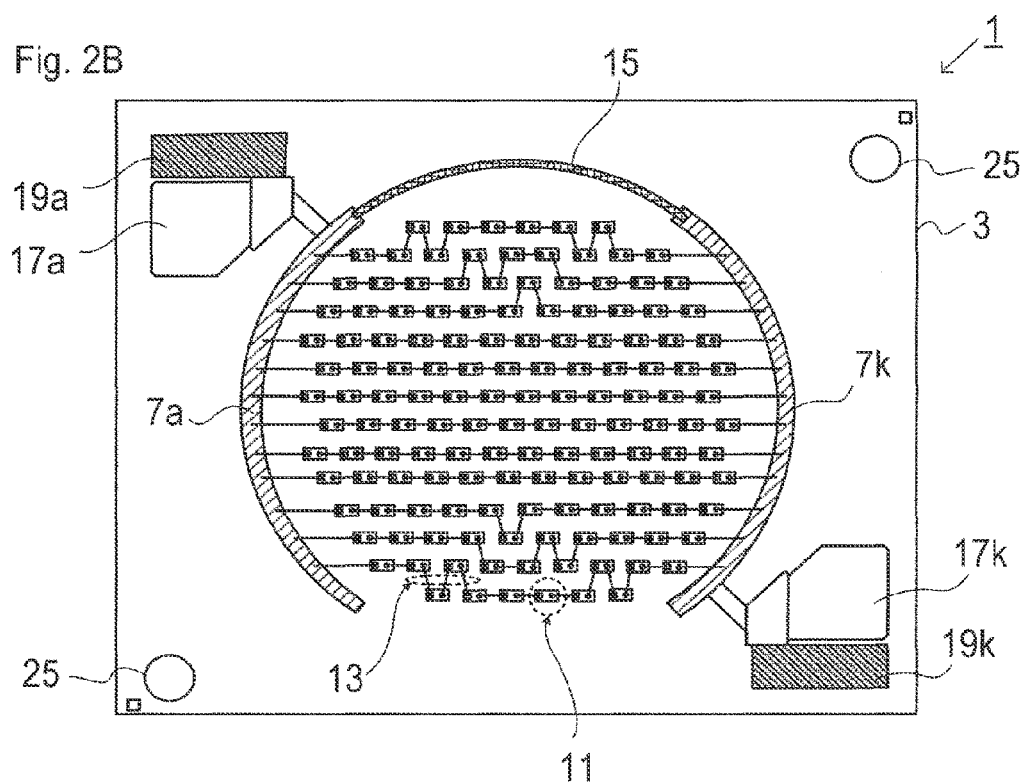

In addition, FIGS. 2A and 2B are schematic views showing a state prior to the state shown in FIG. 1A. FIG. 2A is a view showing a schematic structure before the LED chips 11 are mounted and FIG. 2B is a view showing a schematic structure after the LED chips 11 are mounted and before the phosphor containing resin layer 9 and the resin dam 21 are formed.

The wiring pattern 7a, and the electrode lands 17a and 19a are all electrically connected to an anode terminal, and the wiring pattern 7k, and the electrode lands 17k and 19k are all electrically connected to a cathode terminal.

The ceramic substrate 3 is formed into a rectangular shape. For example, its outline is 24 mm×20 mm, and its thickness is 1 mm.

Thus, the electrode lands 17a and 19a connected to the anode, and the electrode lands 17k and 19k connected to the cathode are arranged at diagonally opposed corner parts of the ceramic substrate 3, respectively.

The soldering electrode lands 17a and 17k are used when an external connection (for the purpose of power supply) with the wiring pattern 7 is made with a solder. Each of them is formed of Ag—Pt by a screen printing method. An example of its thickness is 20 μm.

The Ag—Pt layer is preferably formed on an uppermost layer of each of the soldering electrode lands 17a and 17k, but another metal layer may be thinly formed on the surface of the Ag—Pt layer because it is only necessary to prevent a diffusion reaction to the solder in the Ag—Pt layer. In addition, a metal layer having small specific resistance may be formed under the Ag—Pt layer.

The connector connecting electrode lands 19a and 19k are used when an external connection (for the purpose of power supply) with the wiring pattern 7 is made with a connector. Each of them is formed of Au by a screen printing method. An example of its thickness is 3 μm.

The material Au used for the connector connecting electrode lands 19a and 19k has a feature that prevents an oxide film from being formed on a surface. Thus, the external electric connection can be easily ensured through a connector contact.

In addition, the Au layer is preferably formed on an uppermost surface of each of the connector connecting electrode lands 19a and 19k to be easily connected at the time of the connector contact, but a hard metal layer (such as Ti or W) having small specific resistance may be thinly formed to prevent a damage at the time of the connector contact. In addition, instead of the Au layer, a hard metal which is hardly oxidized and has small specific resistance may be used.

The wiring patterns 7a and 7k are formed on the ceramic substrate 3 so as to be opposed to each other. Each of them has an arc shape which is partially cut out from a circular ring when viewed from the top of the light-emitting device 1. In addition, the soldering electrode land 17a is connected to one end of the wiring pattern 7a through a leading line, and the soldering electrode land 17k is connected to one end of the wiring pattern 7k through a leading line. The connector connecting electrode land 19a is electrically connected to the soldering electrode land 17a through a leading line or a contact electrode, and the connector connecting electrode land 19k is also electrically connected to the soldering electrode land 17k in a similar way.

The printing resistive element 15 is provided in order to enhance an electrostatic withstand voltage, and composed of $RhO_2$ having a resistance value of 50Ω, in which its width is 200 μm and its width is 6 μm. As shown in FIGS. 1A to 2B, the printing resistive element 15 is arranged so as to connect one end of the wiring pattern 7a and one end of the wiring pattern 7k, and has an arc shape partially cut out from a circular ring. According to this embodiment, each of the wiring pattern 7a, the printing resistive element 15, and the wiring pattern 7k constitutes a part of an outer periphery of the same circular ring.

The plurality of LED chips 11 are mounted on the ceramic substrate 3. According to this embodiment, 12 series circuits each composed of 12 LED chips 11 are arranged as parallel lines.

In addition, the LED chips 11 are linearly arranged so as to be roughly parallel to one side of the substrate. Thus, the number of the chips in the line is greatest in the vicinity of the center of the circular ring shape composed of the wiring patterns 7 and the printing resistive element 15, and the number of the chips is reduced toward the periphery of the substrate from the center, so that the LED chips can be densely arranged in an area surrounded by the wiring patterns 7.

When the LED chips 11 are arranged as described above, the outline of the arranged LED chips 11 becomes the same (or similar) shape as the outline of the phosphor containing resin layer 9 (sealed body) when viewed from the top of the light-emitting device 1. According to this embodiment, as shown in FIGS. 1A and 1B, the shape of the sealed body has a circular shape when viewed from the top, and the outline of the arranged LED chips 11 also has a circular shape. This configuration can solve the problem that a light-emitting pattern cannot have the same shape as that of the sealed body due to a shadow caused because a light source is not arranged in the vicinity of the sealed body.

Basically, the adjacent LED chips 11 are directly connected by the wire 13 in the one LED chip line. However, in the vicinity of the periphery of the substrate in which the number of the chips in the same line is smaller, the LED chip is electrically connected to the LED chip in the adjacent line so that the number of the LED chips 11 is to be the same in each series circuit. The LED chip 11 arranged in the vicinity of the wiring pattern 7 is directly and electrically connected to the wiring pattern 7 through the wire.

The resin dam 21 is provided to dam the sealed resin and composed of a colored material (preferably white or milky white). According to this embodiment, the resin dam 21 is composed of a white silicon resin (containing $TiO_2$ as a filler) and formed into a circular ring shape having a width of 1 mm and a diameter of 9 mm. It is formed such that after the resin is applied, it is subjected to a curing treatment at 150° C. for 60 minutes. As shown in FIG. 1A, the resin dam 21 is preferably formed so as to cover the wiring patterns 7, the printing resistive element 15, and a part of the wire 13.

The phosphor containing resin layer 9 is formed to convert the light (such as blue light) emitted from the LED chip to white light. According to this embodiment, a material containing a green phosphor (such as $Ca_3(Sr.Mg)_2Si_3O_{12}:Ce$) and a red phosphor (such as $(Sr.Ca)AlSiN_3:Eu$) is injected into the inner side of the resin dam 21 formed into the ring shape, and thermally cured at 150° C. for 5 hours, whereby the phosphor containing resin layer 9 is formed.

According to this embodiment, as shown in FIG. 1A, the two positioning openings 25 are formed at the diagonally opposed corners of the ceramic substrate 3. This opening 25 is used when a connector jig which will be described below is screwed on the light-emitting device 1.

Figure 3A:
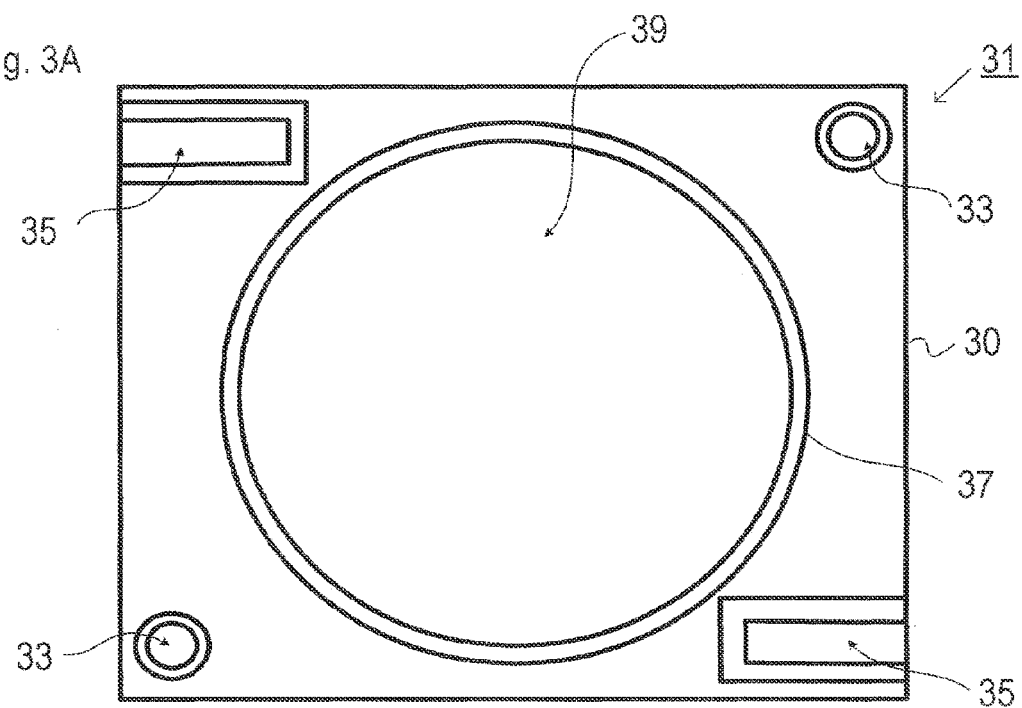
FIGS. 3A and 3B are schematic structure diagrams showing a connector jig, and a state in which the connector jig and the light-emitting device are overlapped, respectively.
Figure 3B:
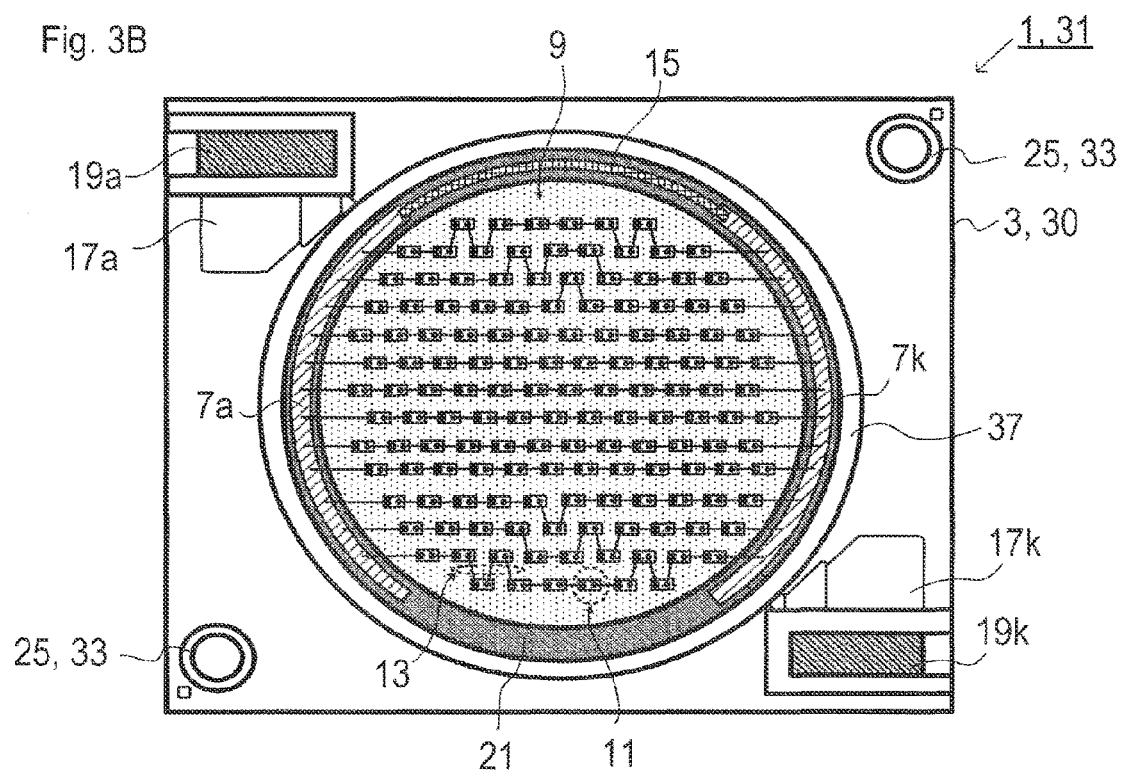

FIGS. 3A and 3B are schematic structure diagrams showing the connector jig, and a state after the connector jig and the light-emitting device 1 are overlapped. FIG. 3A shows the connector jig, and FIG. 3B shows the state after the connector jig and the light-emitting device 1 are overlapped.

A connector jig 31 is provided to electrically connect the connector connecting electrode lands 19 (19a and 19k) formed on the ceramic substrate 3 to an external line, and composed of a resin plate 30 having almost the same size as that of the ceramic substrate 3. A positioning opening 33, a connector terminal opening 35, and a light-emitting surface opening 39 are formed in the resin plate 30. A slanted part 37 is formed on an outer peripheral side surface of the light-emitting surface opening 39 and serves as a reflection member. The resin plate 30 is made of a resin such as PBT (polybutylene terephthalate) resin or a PC (polycarbonate) resin. According to this embodiment, the resin plate 30 is composed of a milky white or white PBT resin having a high reflection rate with respect to light emitted from the light-emitting part.

As shown in FIG. 3A, the positioning openings 33 are provided at one of two pairs of diagonally opposed corners of the connector jig 31, and the connector terminal openings 35 are provided at the other of the two pairs of diagonally opposed corners thereof. The connector terminal opening 35 is configured so that the connector can be inserted from a side surface to the inner side of the resin plate 30.

As shown in FIG. 3B, after the light-emitting device 1 and the connector jig 31 are overlapped, the opening 25 provided in the ceramic substrate 3 of the light-emitting device 1 is overlapped with the positioning opening 33 provided in the connector jig 31. In addition, the light-emitting surface containing the LED chips 11 and the phosphor containing resin layer 9 is exposed in the light-emitting surface opening 39. In addition, each of the connector connecting electrode lands 19a and 19k provided in the light-emitting device 1 is partially opposed to the connector terminal opening 35 provided in the connector jig 31 in a vertical direction. In FIG. 3B, in order to clearly understand that the connector connecting electrode lands 19a and 19k exist under the connector terminal opening 35, the resin plate 30 positioned just above them is transparently shown.

Figure 4:
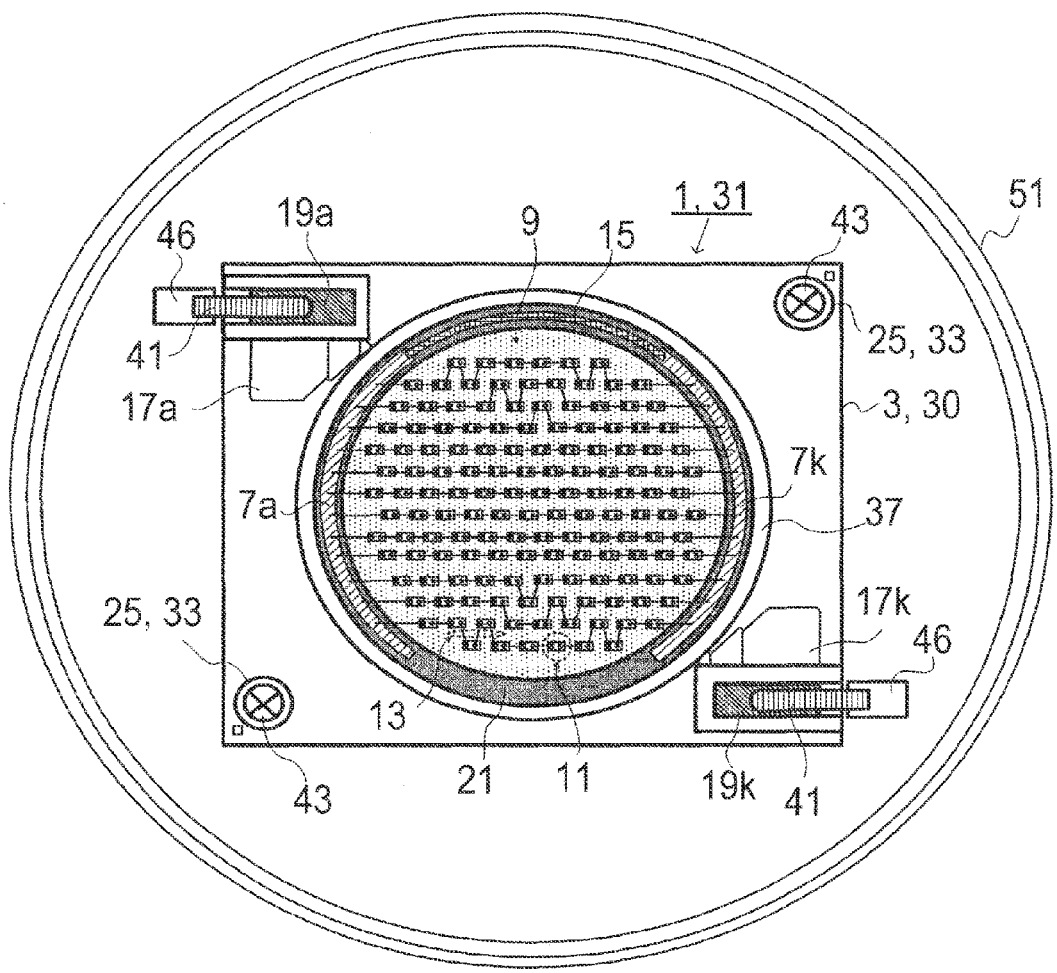
FIG. 4 is a schematic structure diagram showing a state fixed to a case under the condition that the connector jig and the light-emitting device are overlapped.
Figure 5:
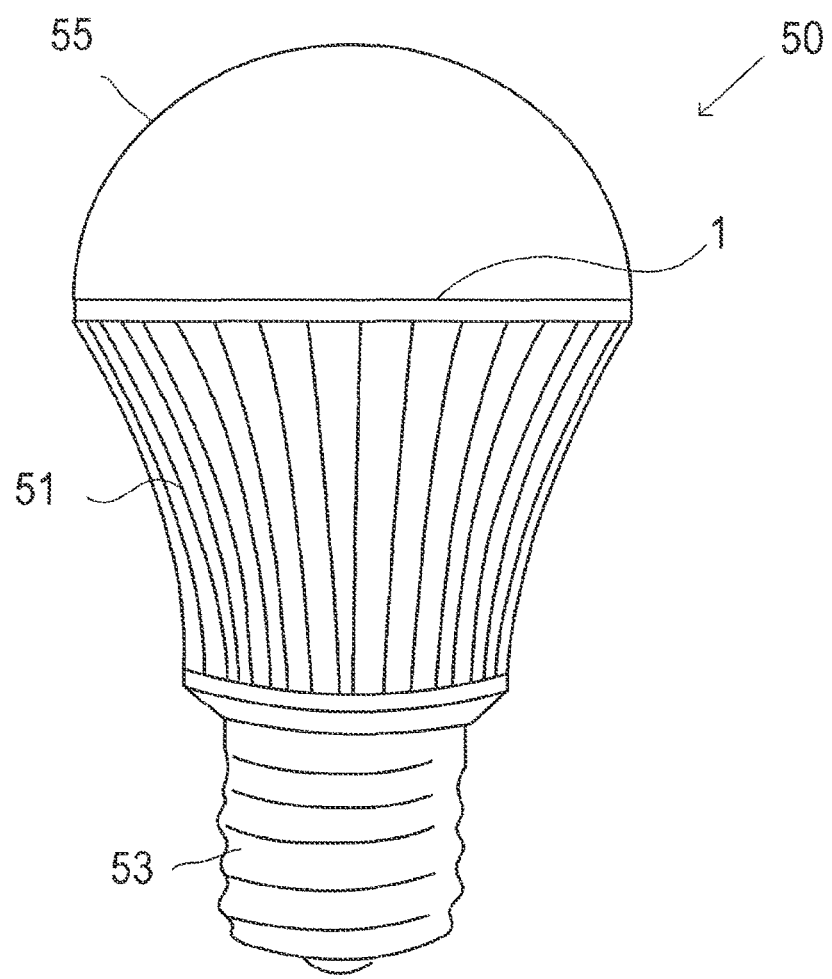
FIG. 5 is an outline view of a lighting device mounting the light-emitting device.

Thus, the connector jig 31 is set and a connector 46 is fit in the connector terminal opening 35, whereby, as shown in FIG. 4, a lead (lead in the connector) 41 attached to the connector is electrically connected to the connector connecting electrode lands 19a and 19k. Thus, a screw 43 (such as M5 screw) is fit in so as to penetrate the openings 25 and 33 and fixed to a case 51. Then, a lens dome 55 is fit in, whereby a LED lighting device 50 is completed (refer to FIG. 5). In addition, in FIG. 5, reference 53 represents a cap and may be integrally provided with the case 51.

FIG. 6 is a conceptual view to explain a method to ensure the electric connection between the connector connecting electrode land 19 and the connector jig 31 when the resin plate 30 of the connector jig 31 and the ceramic substrate 3 of the light-emitting device 1 are to be overlapped. In FIG. 6, reference 45 represents a lead attached to the jig.

As described above, when the light-emitting device 1 and the connector jig 31 are overlapped such that the opening 25 provided in the ceramic substrate 3 and the positioning opening 33 provided in the resin plate 30 are overlapped, the connector terminal opening 35 provided in the connector jig 31 is opposed to the connector connecting electrode land 19 in the vertical direction. The lead 45 attached to the jig is provided in the connector jig 31 to electrically connect the lead 41 in the connector to the connector connecting electrode land 19.

The lead 45 attached to the jig is formed of a conductive material wound into the form of a spring. The spring shape is provided to increase a contact area between the lead 45 and the connector connecting electrode land 19 to disperse force applied at the time of contact to prevent an edge of the lead 45 attached to the jig from sharply coming in contact with the surface of the connector connecting electrode land 19 and damaging the surface after the connector jig 31 and the light-emitting device 1 are overlapped. As described above, when fixed to the case 51, the screw 43 is fit in the opening 25 and 33 so as to penetrate them, so that the lead 45 and the connector connecting electrode land 19 are surely connected electrically.

In addition, as shown in FIG. 6B, it is preferable that a click 48 is previously formed in the connector terminal opening 35 to prevent the connector 46 inserted in the connector terminal opening 35 from escaping.

Figure 7:
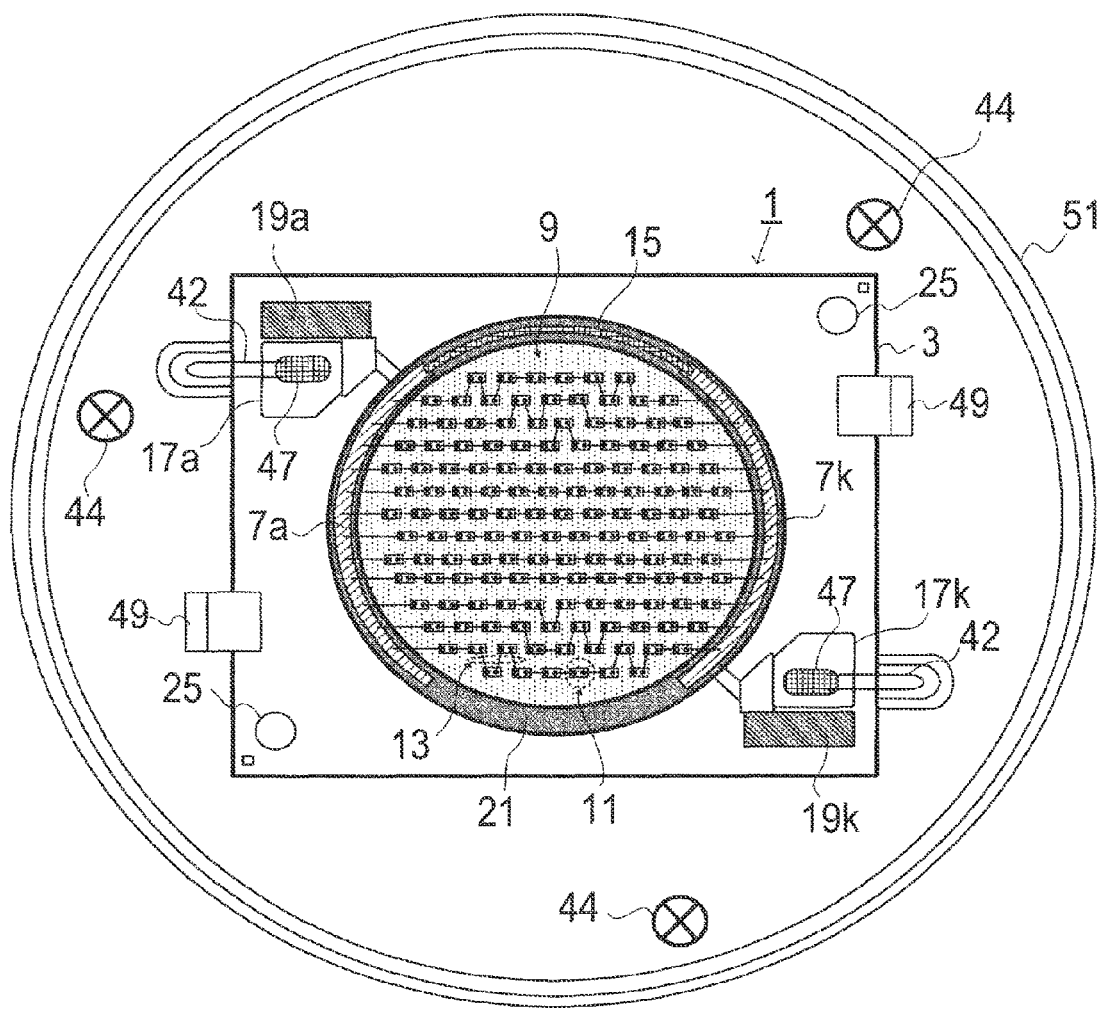
FIG. 7 is a schematic structure diagram showing a state in which the light-emitting device externally connected with a solder is fixed to the case.

In addition, when the light-emitting device 1 of this embodiment is externally connected with soldering, as shown in FIG. 7, the soldering electrode land 17 (17a and 17k) is soldered, whereby an external lead 42 can be electrically connected to the soldering electrode land 17 through a solder 47. Thus, the ceramic substrate 3 is fixed to the case 51 by a press part 49. According to the light-emitting device 1 of this embodiment, although both of the soldering electrode land 17 and the connector connecting electrode land 19 are provided, since each of them is arranged in the vicinity of the corner of the ceramic substrate 3, a space for providing the press part 49 can be sufficiently provided in the periphery of the substrate 3.

Thus, the whole is fixed by a screw 44 with the ceramic substrate 3 and the case 51 fixed to each other by the press part 49. After that, similar to the case of the connector connection, the lens dome 55 is fit in, whereby the LED lighting device 50 is formed (refer to FIG. 5).

According to the configuration of this embodiment, since each of the soldering electrode land 17 (17a and 17k) and the connector connecting electrode land 19 (19a and 19k) is previously provided on the ceramic substrate 3, either one of the methods of soldering and connector connecting can be employed according to a usage mode of a user when the wiring pattern 7 is electrically connected to the outside. In addition, in the case where the external connection is provided with soldering, the conventional problem that Au is diffused in the solder and forms an intermetallic compound so that the electric connection cannot to be ensured is not caused because the soldering electrode land 17 is not formed of Au.

In addition, the LED chips can be densely arranged in the light-emitting device having the circular shape viewed from the top, which contributes to miniaturization of the lighting device having high luminance of 25 W.

Furthermore, in the case where the light-emitting device 1 according to this embodiment is externally connected through the connector, the connector jig having almost the same size as that of the ceramic substrate 3 having the LED chips 11 is overlapped. At this time, since the connector jig 31 has the openings (33, 35, and 39) corresponding to the structure of the ceramic substrate 3, positioning is automatically made when it is overlapped. Thus, the light-emitting part (LED chips 11) of the light-emitting device 1 can be positioned. In addition, since the connector jig 31 is composed of the resin plate 30, the ceramic substrate 3 having the LED chips 11 can be protected.

[Variation]

The arrangement positions of the soldering electrode land 17 and the connector connecting electrode land 19 are not limited to those shown in FIG. 1A. Hereinafter, a variation will be described with reference to FIGS. 8A to 9B.

Figure 8A:
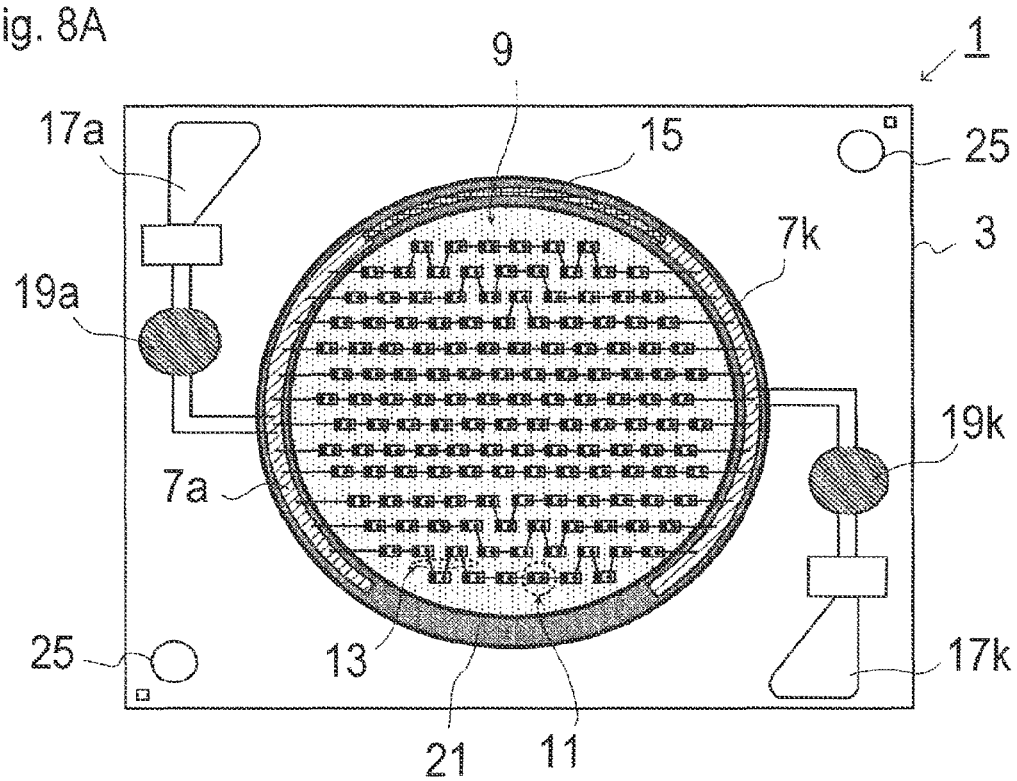
FIGS. 8A and 8B are schematic structure diagrams showing another example of the light-emitting device according to the present invention.

According to a variation shown in FIG. 8A, the light-emitting device 1 is provided such that the wiring pattern 7a is electrically connected to the connector connecting electrode land 19a through a leading line connected to a region around the center of the wiring pattern 7a, and the wiring pattern 7a is electrically connected to the soldering electrode land 17a through a leading line extending from the connector connecting electrode land 19a. This is applied to the connector connecting electrode land 19k and the soldering electrode land 17k.

Figure 8B:
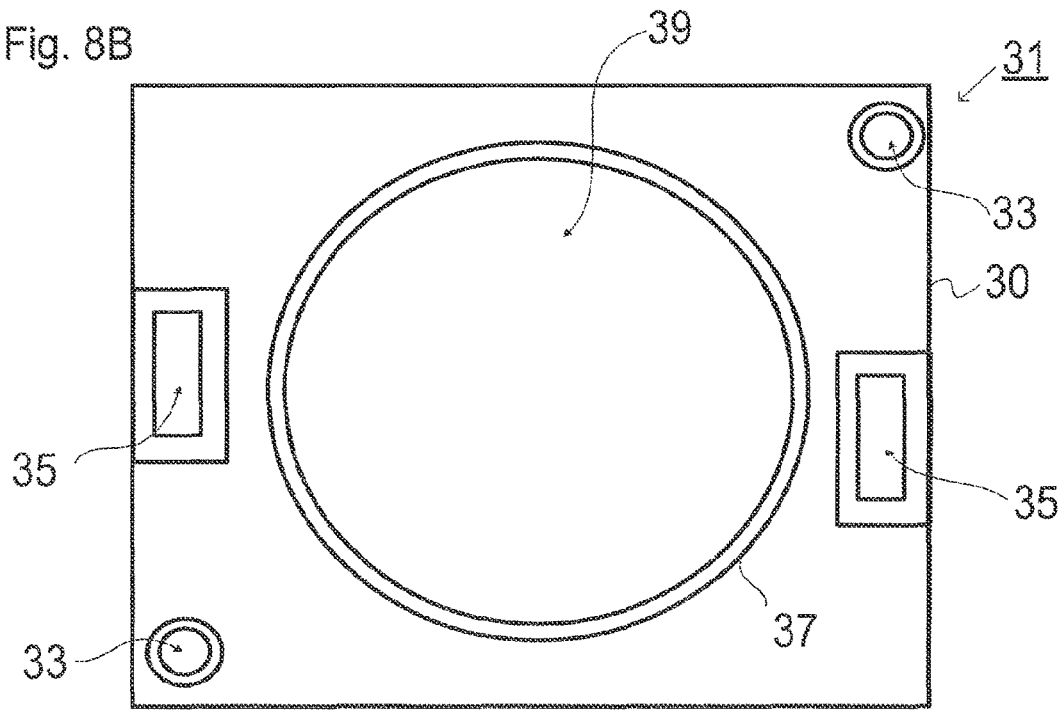

When the wiring pattern 7 is externally connected through the connector terminal, in the light-emitting device 1 shown in FIG. 8A, the connector jig 31 shown in FIG. 8B is overlapped with the ceramic substrate 3. The connector jig 31 shown in FIG. 8B is provided such that the connector terminal openings 35 are arranged almost in the center of opposed one pair of sides, in a peripheral part of the resin plate 30, and the connector jig 31 is overlapped with the ceramic substrate 3, whereby each of the connector connecting electrode lands 19 (19a and 19k) is partially exposed in each of the connector terminal openings 35. The positioning opening 33 and the light-emitting surface opening 39 are formed similarly to the above embodiment.

Thus, the external connection can be made through the connector by the same method as shown in FIG. 4, and the external connection can be made through the solder by the same method as shown in FIG. 7.

In addition, according to a variation shown in FIG. 9A, the light-emitting device 1 is provided such that the connector connecting electrode lands 19a and 19k are arranged at one diagonally opposed pair of corners of the ceramic substrate 3, and the soldering electrode lands 17a and 17k are arranged at the other diagonally opposed pair of corners of the ceramic substrate 3. That is, the connector connecting electrode lands 19a and 19k, and the soldering electrode lands 17a and 17k are formed at the four corners of the ceramic substrate 3, respectively. In addition, the opening 25 is provided almost in the center of the opposed one pair of sides, in a peripheral part of the ceramic substrate 3.

Thus, the connector connecting electrode land 19a is electrically connected to one terminal of the wiring pattern 7a through a leading line, and the soldering electrode land 17a is electrically connected to the other terminal of the wiring pattern 7a through a leading line. Similarly, the connector connecting electrode land 19k is electrically connected to one terminal of the wiring pattern 7k through a leading line, and the soldering electrode land 17k is electrically connected to the other terminal of the wiring pattern 7k through an leading line.

When the wiring pattern 7 is externally connected through a connector terminal, in the light-emitting device 1 shown in FIG. 9A, the connector jig 31 shown in FIG. 9B is overlapped with the ceramic substrate 3. The connector jig 31 shown in FIG. 9B is provided such that the connector positioning openings 33 are arranged almost in the center of opposed one pair of sides, in a peripheral part of the resin plate 30, and the connector jig 31 is overlapped with the ceramic substrate 3, whereby the positioning openings 33 are overlapped with the openings 25, respectively. In addition, the connector terminal openings 35 are provided at one diagonally opposed pair of corners, and when the connector jig 31 is overlapped with the ceramic substrate 3, the connector connecting electrode land 19 is partially exposed in the connector terminal opening 35.

Thus, the external connection can be made through the connector by the same method as shown in FIG. 4, and the external connection can be made through the solder by the same method as shown in FIG. 7.

Figure 10A:
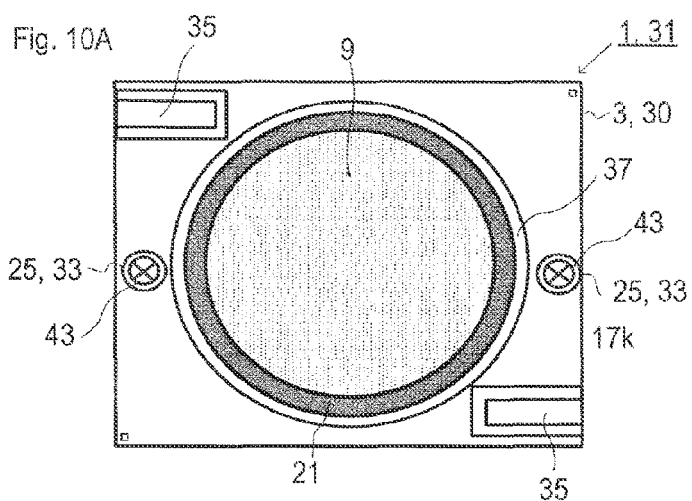
FIGS. 10A and 10B are schematic structure diagrams showing a state in which the connector jig and the light-emitting device are overlapped.
Figure 10B:
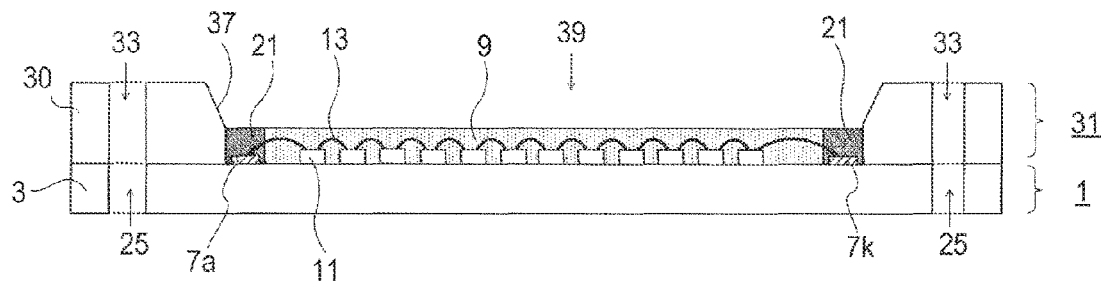
Figure 12:
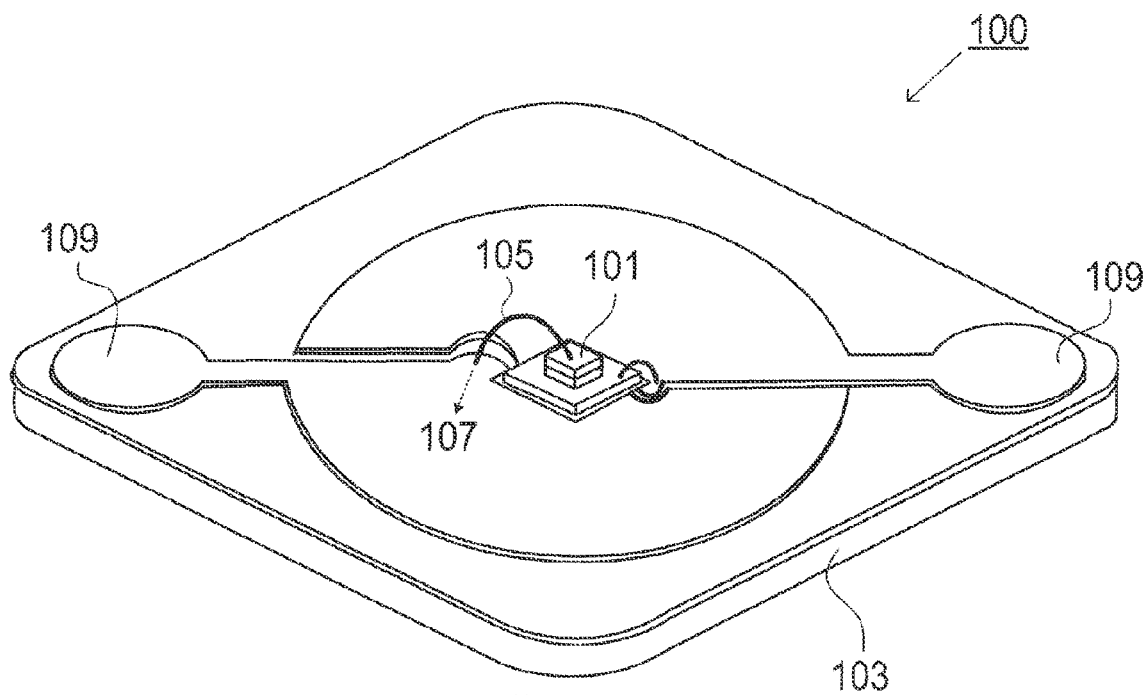
FIG. 12 is a schematic structure diagram of a conventional lighting device.

FIGS. 10A and 10B are additional schematic structure diagrams showing the state in which the connector jig 31 and the light-emitting device 1 are overlapped, in the configuration shown in FIGS. 9A and 9B. FIG. 10A is a view showing a state when viewed from the top without a part of the light-emitting device being transparently shown, and FIG. 10B is a view showing a cross-sectional state cut by a line connecting the two opposed openings 25 (33). As described above, the LED chips 11 are formed under the resin layer 9, and the lead 45 attached to the jig and the connector connecting electrode land 19 are formed under the connector connecting opening 35 although not shown in the drawing.

FIGS. 11A and 11B are additional schematic structure diagrams showing the state in which the connector jig 31 and the light-emitting device 1 are overlapped, in the configurations shown in FIGS. 1A and 1B, and FIGS. 8A and 8B, respectively when viewed from the top without a part of the light-emitting device being transparently shown, similar to FIG. 10A. FIGS. 10A and 10B, and FIGS. 11A and 11B are provided to understand the structure.

Other Embodiments

Hereinafter, other embodiments will be described.

(1) While the ceramic substrate is used as the substrate 3 in the above embodiment, the substrate may be a metal core substrate provided such that an insulation layer is formed on a surface of a metal substrate serving as a core.

(2) While the soldering electrode land 17 is made of Ag—Pt in the above embodiment, it only has to contain a conductive material (corresponding to a first conductive material) having a function to prevent diffusion to the solder. Thus, the material may include Ag or Ag—Pd other than the Ag—Pt. In addition, at this time, it is preferable that an uppermost surface part which is in contact with at least the solder is made of the first conductive material.

In addition, while the connector connecting electrode land 19 is made of Au in the above embodiment, it only has to contain a conductive material (corresponding to a second conductive material) having a function to prevent oxidation from proceeding. The material Au is used as one example of the conductive material to prevent the oxidation from proceeding. In addition, at this time, it is preferable that an uppermost surface which is in contact with the lead (the lead 45 attached to the jig in the structure shown in FIG. 6) electrically connected to at least the connector is made of the second conductive material.

(3) While the adjacent LED chips 11 are directly and electrically connected by the wire 13 in the above embodiment, they may be connected through a relay electrode.

(4) While the soldering electrode land 17 is provided on the same side (main surface side) as the connector connecting electrode land 19, on the ceramic substrate 3 in the above embodiment, it may be provided on a back surface side of the substrate 3. In this case, a penetration electrode which penetrates the substrate to be connected to the wiring pattern 7 is provided, so that the soldering electrode land 17 provided on the back surface side is electrically connected to the penetration electrode.

In addition, the soldering electrode land 17 may be provided on a side surface of the substrate 3.

(5) The shapes of the electrode lands (17 and 19) and the openings (25, 33, and 35) are only shown as one example, and other shapes may be employed.

(6) While the resin plate 30 constituting the connector jig 31 has almost the same size as that of the ceramic substrate 3 having the LED chips 11 in the above embodiment, the resin plate 30 may have any size. However, with a view to miniaturizing the lighting device 50, the resin plate 30 is preferably miniaturized within a range in which the openings (25 and 33) of the resin plate 30 and the ceramic substrate 3 can be overlapped. That is, it is preferable that the outer periphery of the connector jig 31 does not protrude from the outer periphery of the light-emitting device 1 when viewed from a direction perpendicular to the overlapped surface of the light-emitting device and the connector jig.

(7) While one or both of the soldering electrode land 17 and the connector connecting electrode land 19 are arranged at the corners of the ceramic substrate 3 in the above embodiment, the arrangement position is not limited to the corner. However, the case where the electrode land is arranged at the corner of the ceramic substrate 3 is preferable because a space for the opening 25 can be sufficiently ensured in the ceramic substrate 3, and a ratio of the light emitted from the LED chip 11 absorbed by the electrode lands (17 and 19) can be reduced.

(8) While the connector jig 31 is composed of the white or milky white resin plate 30 in the above embodiment, the connector jig 31 may be composed of a transparent member in a case where it is used only for fixing the ceramic substrate 3 to ensure the connector connection without having a function as a reflection member.

(9) While the light-emitting device 1 has the printing resistive element 15 in the above embodiment, the printing resistive element is not necessarily provided when the withstand voltage protecting function is not executed. In addition, as an element having the withstand voltage protecting function, a zener diode may be mounted instead of the printing resistive element.

(10) While the 12 series circuits each composed of 12 LED chips 11 connected in series are arranged as parallel lines on the substrate 3 in the above embodiment, as a matter of course, the number of the LED chips 11 connected in series, and the number of the series circuits (parallel line number) are not limited to the above numbers. In addition, the number of chips connected in series is not necessarily equal to the number of the parallel series circuits.

In addition, in FIG. 1A, the LED chips 11 of the adjacent lines are appropriately connected in series in the vicinity of the peripheral part of the substrate in which the number of the chips belonging to the same line is smaller, so that the number of the LED chips 11 constituting the series circuit can be equalized. At this time, the LED chips 11 in the three or more adjacent lines may be incorporated as the components of the series circuit.

In addition, in FIG. 1A, the LED chips 11 of the adjacent lines are appropriately connected in series in the vicinity of the peripheral part of the substrate in which the number of the chips belonging to the same line is smaller, so that the number of the LED chips 11 constituting the series circuit can be equalized. At this time, the LED chips 11 in the three or more adjacent lines may be incorporated as the components of the series circuit.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A light-emitting device comprising:
a substrate;
a resin dam formed on a primary surface of said substrate and provided so as to surround a mounting area around a center of said substrate;
a first electrode land and a second electrode land which are electrodes to be connected to a power supply, said first and second electrode lands being provided on the primary surface of said substrate and outside said resin dam;
a first wiring pattern provided on the primary surface of said substrate and electrically connected to said first electrode land, said first wiring pattern including a first portion located under said resin dam and curved along said resin dam;
a second wiring pattern provided on the primary surface of said substrate and electrically connected to said second electrode land, said second wiring pattern including a second portion located under said resin dam and curved along said resin dam;
a first series of LED chips provided on the mounting area and electrically connected in series between said first wiring pattern and said second wiring pattern,
a second series of LED chips provided on the mounting area and electrically connected in series between said first wiring pattern and said second wiring pattern, a number of LED chips in said first series being same number as the LED chips in said second series;
a first wire connected between the first portion of said first wiring pattern and the LED chip at the end of said first series, said first wire being contacted with the first portion at a first contact point;
a second wire connected between the second portion of said second wiring pattern and the LED at the other end of said first series, said second wire being contacted with the second portion at a second contact point;
a third wire connected between the first portion of said first wiring pattern and the LED chip at the end of said second series, said third wire being contacted with the first portion at a third contact point;
a fourth wire connected between the second portion of said second wiring pattern and the LED at the other end of said second series, said fourth wire being contacted with the second portion at a fourth contact point, a distance between the third and fourth contact points being smaller than a distance between the first and second contact points; and
a resin layer provided attaching to an inner side of said resin dam and covering said first and second series of LED chips and said first, second, third and fourth wires.

2. The light-emitting device of claim 1, wherein
said substrate comprises a rectangular outer shape in a top view, and
said first and second electrode lands are located near corners of said substrate diagonally opposite to each other.

3. The light-emitting device of claim 2, wherein
said substrate has first and second openings diagonally located at corners of said substrate other than the corners where said first and second electrode lands are located.

4. The light-emitting device of claim 1, wherein said resin layer comprises a phosphor, and a color of said resin dam is white.

5. The light-emitting device of claim 4, wherein
said substrate comprises ceramic, and
said first and second electrode lands include gold.

6. The light-emitting device of claim 5, wherein said resin dam comprises silicon resin containing titanium oxide.

7. The light-emitting device of claim 5, further comprising a resistive element inserted between said first and second wiring patterns and located under said resin dam.

8. The light-emitting device of claim 4, wherein
said substrate comprises ceramic, and
said first and second electrode lands include silver.

9. The light-emitting device of claim 4, wherein
said substrate comprises ceramic, and
said first and second electrode lands include platinum.

10. The light-emitting device of claim 1, wherein the LED chips in said second series are arranged in a plurality of rows.

11. The light-emitting device of claim 10, wherein the LED chips in said first series are arranged in a plurality of rows.

12. The light-emitting device of claim 11, wherein
most of the LED chips in said first series are arranged in a first row,
most of the LED chips in said second series are arranged in a second row, and
a number of the LED chips arranged in the second row is smaller than a number of the LED chips arranged in the first row.

* * * * *